United States Patent [19]

Fritz

[11] 4,454,168

[45] Jun. 12, 1984

[54] PRINTED CIRCUITS PREPARED FROM METALLIZED PHOTOADHESIVE LAYERS

[75] Inventor: Herbert L. Fritz, Englishtown, N.J.

[73] Assignee: E. I. Du Pont de Nemours and Company, Wilmington, Del.

[21] Appl. No.: 427,420

[22] Filed: Sep. 29, 1982

[51] Int. Cl.³ ............................................. H05K 3/18
[52] U.S. Cl. ....................................... 427/96; 427/98; 427/203; 427/436; 430/198; 430/291; 204/38 B
[58] Field of Search ................... 427/96, 98, 203, 436; 430/198, 291; 204/38 B

[56] References Cited

U.S. PATENT DOCUMENTS

| | | | |
|---|---|---|---|
| 3,226,256 | 12/1965 | Schneble et al. | 117/212 |
| 3,259,559 | 7/1966 | Schneble et al. | 204/38 |
| 3,332,860 | 7/1967 | Diebold | 427/436 |
| 3,664,933 | 5/1972 | Clauss | 204/385 |
| 3,716,462 | 2/1973 | Jensen | 204/38 |
| 4,171,393 | 10/1979 | Donley et al. | 427/217 |
| 4,385,082 | 5/1983 | Eichelberger | 427/58 |
| 4,404,237 | 9/1983 | Eichelberger | 427/96 |

*Primary Examiner*—John D. Smith

[57] ABSTRACT

Process for preparation of printed circuits by applying particulate metal to tacky image areas, optionally removing excess particulate metal, and contacting the metallized image areas with an aqueous solution comprising cations of a plating metal to accomplish a metal-metal ion displacement reaction, the solution being substantially free of any chemical reducing agent for said cations. Preferably the conductive circuit is electroplated or soldered.

12 Claims, No Drawings

PRINTED CIRCUITS PREPARED FROM METALLIZED PHOTOADHESIVE LAYERS

DESCRIPTION

1. Technical Field

This invention relates to a process for the preparation of conductive circuits. More particularly this invention relates to a method for making conductive circuits using metallized adhesive layers.

2. Background Art

The preparation of printed circuits, including multilayer printed circuits is known. Powdered materials such as particulate metals have been applied to surfaces having imagewise tacky and nontacky areas by a number of toning methods to produce printed circuit patterns. Representative methods are disclosed in U.S. Pat. Nos. 3,060,024; 3,649,268; 4,054,479; 4,054,483; 4,157,407 and 4,234,626. After the particulate metal is applied to the tacky image areas, it is generally necessary to remove unwanted particles, e.g., mechanically, from the nontacky image areas. Conductive circuits can be formed by additive techniques such as electroless plating, etc. Printed circuits prepared by electroless plating have several disadvantages. Electroless plating is expensive, difficult to control, relatively slow and environmentally hazardous. Electrolessly plated copper also is more brittle than copper that is electroplated.

An object of this invention is to provide an improved process, including a continuous process, whereby electrically conductive printed circuits can be prepared by additive procedures without using electroless plating wherein the metallization step to form the electrically conductive circuits is more easily controlled, cheaper, quicker and environmentally more desirable.

DISCLOSURE OF THE INVENTION

In accordance with this invention there is provided a process for the preparation of electrically conductive circuits from an element having tacky and nontacky image areas which comprises:

(a) applying particulate metal to the tacky image areas of the element;

(b) optionally removing excess particulate metal; and (c) contacting the metallized element with an aqueous solution comprising cations of a plating metal which is more electronegative than said particulate metal to accomplish a metal-metal ion displacement reaction and being substantially free of any chemical reducing agent for said cations whereby there is provided a conductivity of at least about 1 to 2 mhos/square.

The electrically conductive circuits prepared by the above-defined process of this invention include standard as well as flexible circuits. "Flexible circuits" which as used herein mean circuits wherein a 0.001 inch (0.025 mm) thick layer laminate consisting of hardened material and circuit material can be repeatedly bent around a curved surface, e.g., a cylinder, having a diameter of 0.6 inch (15.24 mm) or less, preferably 0.375 inch (9.53 mm) without breaking, cracking or delaminating. For circuits having layer laminates with thicknesses different from 0.001 inch (0.025 mm), the above curved surface diameter criteria would be increased or decreased proportionately with the proviso that the minimum diameter of the curved surface would always be greater than 0.25 inch (6.35 mm). Thus for a circuit layer laminate of 0.010 inch (0.254 mm) the curved surface would have a diameter of 6 inches (15.24 cm) or less and preferably 3.75 inches (9.53 cm). It is understood that the flexible support should have flexibility at least comparable to the layer laminate. The term "adhesive" refers to the areas where the particulate metal adheres and as used herein includes "photoadhesive" which includes photohardenable and photopolymerizable systems in which the molecular weight of at least one component thereof is increased by exposure to actinic radiation sufficiently to result in a change in the rheological and thermal behavior of the exposed areas. Photocrosslinkable, photocurable and photodimerizable compositions are included in the definition of photohardenable.

The elements having tacky and nontacky image areas are critical to the operation of the process of this invention. A layer of an adhesive material is formed on a support. Preferred adhesive materials are photoadhesive. Generally a flexible cover sheet is applied to protect the adhesive surface of the element, e.g., during storage. The cover sheet is not absolutely necessary, however. The process is also useful with multilayer elements, e.g., a support bearing, in order, a tacky nonphotosensitive layer and a photohardenable or photopolymerizable layer. A cover sheet may be present in the element. After imagewise exposure and removal of the cover sheet, if present, or liquid development, nontonable image areas are present in the upper photohardened layer and tacky image areas are present in the lower nonphotosensitive layer of the element.

The types of adhesive material or compositions used is extremely important since in layer form the surface must be tacky and receptive to particulate metal and must be able to withstand the rigors of the other process steps including the electroplating or soldering as well as any heating and curing steps. In addition, for the flexible embodiment, it is critical that the flexibility of the layer not be affected by the process of preparing the flexible circuit.

Useful adhesive materials and compositions include: combination of a thermosetting resin and flexible adhesive resin. Suitable thermosetting resins include: oil soluble phenolic type resins, e.g., fusible copolymers of phenol, resorcinol, a cresol or a xylenol with an aldehyde or with furfural; polyester resins, e.g., reaction products of phthalic or maleic anhydride with mono-, di- or polyethylene glycols (also crosslinked by reaction with styrene); epoxy resins, e.g., reaction product of epichlorohydrin with bisphenol-A. Suitable flexible adhesive resins are: epoxy resins, polyvinyl acetal resins, polyvinyl alcohol resins, polyvinyl acetate resins, etc; chlorinated rubber, butadiene/acrylonitrile copolymers, etc. Generally present in the flexible adhesive resins are polar groups, e.g., nitrile, epoxide, acetal and hydroxyl groups. Other known adhesive compositions which meet the above criteria are also useful.

Preferred photoadhesive compositions include: photohardenable compositions, photopolymerizable compositions capable of addition polymerization which are preferred, as well as photocrosslinkable, photocurable, and photodimerizable compositions. Photopolymerizable compositions generally contain at least one of the below-listed monomers, preferably addition polymerizable ethylenically unsaturated compounds having at least two terminal ethylenic groups, free radical generating addition polymerization initiators or initiator systems activatable by actinic radiation and at least one organic polymeric binder, preferably an elastomeric compound, present in a predominant amount. Other components noted below can also be present in the compositions. The monomer is present in 10 to 50 parts by weight, preferably 15 to 30 parts by weight; the initiator is present in 1 to 10 parts by weight, preferably 4 to 7 parts by weight; and the binder in 85 to 50 parts by weight, all based on the total weight of the composition. In layer form the composition is preferably 0.0005 to 0.006 inch (0.013 to 0.152 mm) in thickness.

Monomers: t-butyl acrylate, 1,5-pentanediol diacrylate, N,N-diethylaminoethyl acrylate, ethylene glycol diacrylate, 1,4-butanediol diacrylate, diethylene glycol diacrylate, hexamethylene glycol diacrylate, 1,3-propanediol diacrylate, decamethylene glycol diacrylate, decamethylene glycol dimethacrylate, 1,4-cyclohexanediol diacrylate, 2,2-dimethylol propane diacrylate, glycerol diacrylate, tripropylene glycol diacrylate, glycerol triacrylate, trimethylolpropane triacrylate, pentaerythritol triacrylate, 2,2-di(p-hydroxyphenyl)-propane diacrylate, pentaerythritol tetraacrylate, 2,2-di(p-hydroxyphenyl)-propane dimethacrylate, triethylene glycol diacrylate, polyoxyethyl-2,2-di(p-hydroxyphenyl)-propane dimethacrylate, di-(3-methacryloxy-2-hydroxypropyl) ether of Bisphenol-A, di-(2-methacryloxyethyl) ether of Bisphenol-A, di-(3-acryloxy-2-hydroxypropyl) ether of Bisphenol-A, di-(2-acryloxyethyl) ether of Bisphenol-A, di-(3-methacryloxy-2-hydroxypropyl) ether of tetrachloro-Bisphenol-A, di-(2-methacryloxyethyl) ether of tetrachloro-Bisphenol-A, di-(3-methacryloxy-2-hydroxypropyl) ether of tetrabromo-Bisphenol-A, di-(2-methacryloxyethyl) ether of tetrabromo-Bisphenol-A, di-(3-methacryloxy-2-hydroxypropyl) ether of 1,4-butanediol, di-(3-methacryloxy-2-hydroxypropyl) ether of diphenolic acid, triethylene glycol dimethacrylate, polyoxypropyltrimethylol propane triacrylate, ethylene glycol dimethacrylate, butylene glycol dimethacrylate, 1,3-propanediol dimethacrylate, 1,2,4-butanetriol trimethacrylate, 2,2,4-trimethyl-1,3-pentanediol dimethacrylate, pentaerythritol trimethacrylate, 1-phenyl ethylene-1,2-dimethacrylate, pentaerythritol tetramethacrylate, trimethylol propane trimethacrylate, 1,5-pentanediol dimethacrylate, diallyl fumarate, styrene, 1,4-benzenediol dimethacrylate, 1,4-diisopropenyl benzene, and 1,3,5-triisopropenyl benzene.

In addition to the ethylenically unsaturated monomers mentioned above, the photoadhesive layer can also contain at least one of the following free-radical initiated, chain-propagating, addition polymerizable, ethylenically unsaturated compounds having a molecular weight of at least 300. These monomers include, preferably, an alkylene or a polyalkylene glycol diacrylate prepared from an alkylene glycol of 2 to 15 carbons or a polyalkylene ether glycol of 1 to 10 ether linkages, and those disclosed in U.S. Pat. No. 2,927,022, which is incorporated by reference, e.g., those having a plurality of addition polymerizable ethylenic linkages, particularly when present as terminal linkages, and especially those wherein at least one and preferably most of such linkages are conjugated with a double bonded carbon, including carbon doubly bonded to carbon and to such hetero atoms as nitrogen, oxygen and sulfur. Outstanding are such materials wherein the ethylenically unsaturated groups, especially the vinylidene groups, are conjugated with ester or amide structures.

Initiators: substituted or unsubstituted polynuclear quinones which are compounds having two intracyclic carbon atoms in a conjugated carbocyclic ring system. Suitable such initiators include 9,10-anthraquinone, 1-chloroanthraquinone, 2-chloroanthraquinone, 2-methylanthraquinone, 2-ethylanthraquinone, 2-tert-butylanthraquinone, octamethylanthraquinone, 1,4-naphthoquinone, 9,10-phenanthrenequinone, 1,2-benzanthraquinone, 2,3-benzanthraquinone, 2-methyl-1,4-naphthoquinone, 2,3-dichloroanaphthoquinone, 1,4-dimethylanthraquinone, 2,3-dimethylanthraquinone, 2-phenylanthraquinone, 2,3-diphenylanthraquinone, sodium salt of anthraquinone alphasulfonic acid, 3-chloro-2-methylanthraquinone, retenequinone, 7,8,9,10-tetrahydronaphthacenequinone, and 1,2,3,4-tetrahydrobenz(a) anthracene-7,12-dione. Other photoinitiators which are also useful, even though some may be thermally active at temperatures as low as 85° C., are described in Plambeck U.S. Pat. No. 2,760,863 and include vincinal ketaldonyl compounds, such as diacetyl, benzil, etc.; α-ketaldonyl alcohols, such as benzoin, pivaloin, etc.; acyloin ethers, e.g., benzoin methyl and ethyl ethers, etc; α-hydrocarbon substituted aromatic acyloins, including α-methylbenzoin, α-allylbenzoin and α-phenylbenzoin. In addition the photoreducible dyes and reducing agents disclosed in U.S. Pat. Nos. 2,850,445; 2,875,047; 3,097,096; 3,074,974; 3,097,097; and 3,145,104 as well as dyes of the phenazine, oxazine, and quinone classes may be used. Other suitable polymerization initiators are Michler's ketone, benzophenone, 4,4'-dichlorobenzophenone, 2,4,5-triphenylimidazolyl dimers with hydrogen doners, and mixtures thereof as described in U.S. Pat. Nos. 3,427,161; 3,479,185 and 3,549,367. All the aforementioned U.S. Patents are incorporated by reference.

Binders: A. Elastomeric compounds: synthetic rubbers, e.g., butadiene/acrylonitrile, acrylonitrile/butadiene (carboxy-modified, e.g., 3%) acrylonitrile/butadiene/styrene, alkyl (1 to 4 carbon atoms) methacrylate/acrylonitrile/butadiene, alkyl (1 to 4 carbon atoms) methacrylate/styrene/acrylonitrile/butadiene interpolymers, 2-chlorobutadiene/1,3-polymers, chlorinated rubber, styrene/butadiene/styrene, styrene/isoprene/styrene block copolymers and other block copolymers described by Holden et al. in U.S. Pat. No. 3,265,765 which is incorporated by reference, n-butyl methacrylate, polyether polyurethane resin, etc.

B. Nonelastomeric Compounds include: polyacrylate and alpha-alkyl polyacrylate esters, e.g., polymethyl methacrylate and polyethylmethacrylate; polyvinyl esters, e.g., polyvinyl acetate, polyvinyl acetate/acrylate, polyvinyl acetate/methacrylate and hydrolyzed polyvinyl acetate; ethylene/vinyl acetate copolymers; polystyrenes; vinylidene chloride copolymers, e.g., vinylidene chloride/acrylonitrile, vinylidene chloride/methacrylate and vinylidene chloride/vinyl acetate copolymers; polyvinyl chloride and copolymers, e.g., polyvinyl chloride/acetate; high molecular weight polyethylene oxides of polyglycols having average molecular weights of 4000 to 1,000,000; epoxides; copolyesters, e.g., those prepared from the reaction product of a polymethylene glycol of the formula $HO(CH_2)_nOH$, where n is a whole number 2 to 10 inclusive, and (1) hexahydroterephthalic, sebacic and terephthalic acids, (2) terephthalic, isophthalic and sebacic acids, (3) terephthalic and sebacic acids, (4) terephthalic and isophthalic acids, and (5) mixtures of copolyesters prepared from said glycols and (i) terephthalic, isophthalic and sebacic acids and (ii) terephthalic, isophthalic, sebacic and adipic acids; nylons or polyamides, e.g., N-methoxymethyl polyhexamethylene adipamide; cellulose esters, e.g., cellulose acetate, cellulose acetate succinate and cellulose acetate butyrate; cellulose ethers, e.g., methyl cellulose, ethyl cellulose and benzyl cellulose, polycarbonates; polyvinyl acetal, e.g., polyvinyl butyral, polyvinyl formal; polyformaldehydes.

C. Combination of Binder Types A and B. The polymeric molecular weights are expressed as number average molecular weights and can be determined by gel permeation chromatography employing a polybutadiene standard or other standard known to those skilled in the art.

Other optional additives that can be present in the adhesive layer or image include: dyes, pigments, plasticizers and, in the photoadhesive compositions, inhibitors.

Various dyes may be added to increase the visibility of the image formed. Pigments may also be used in this capacity. Any colorant used, however, should preferably be transparent to the actinic radiation used.

Useful plasticizers may be a monomer, e.g., a diacrylate ester, or any of the common plasticizers which are compatible with the polymeric binder, e.g., dialkyl phthalate, polyethylene glycol, and alkyl phosphates.

Suitable thermal polymerization inhibitors include p-methoxyphenol, hydroquinone, and alkyl and aryl-substituted hydroquinones and quinones, tert-butyl catechol, pyrogallol, copper resinate, naphthylamines, beta-naphthol, cuprous chloride, 2,6-di-tert-butyl-p-cresol, phenothiazine, pyridine, nitroso dimers, e.g., 1,4,4-tri-methyl-2,3,-diazobicyclo-[3.2.2]-non-2-ene-2,3-dioxide, dinitrobenzene, p-toluquinone and chloranil.

Any type support can be used which have been used previously to make printed circuits. Such supports should not react with the plating baths. Suitable supports include: polyethylene terephthalate, flame-treated polyethylene terephthalate, electrostatic discharge treated polyethylene terephthalate, silicone treated polyethylene terephthalate, polyimides, polyolefins, e.g., polypropylene; polyparabanic acid, etc. Additional supports include: sheets, plates, synthetic resin plates, synthetic resin laminated plates or composites, etc. having the necessary electrical and mechanical properties, chemical resistance, heat resistance, etc. Examples of resins include: phenol-formaldehyde, epoxy and melamine resins, etc. Glass plates, ceramic or ceramic coated metal plates are also useful. The sustrate can also be wooden sheet material, cardboard, paper base phenolic resin laminate, etc. Metal sheets, e.g., with holes, can be used provided that the material adhered thereto acts as a barrier between the metal sheet support and the metallized circuit.

Suitable removable cover sheets that may be present are: silicone treated polypropylene, polyethylene, polyethylene terephthalate, silicone treated polyethylene terephthalate, etc.

The adhesive material is present on the support in the form of the circuit desired, in the form of a layer of the adhesive material or composition, e.g., photoadhesive layer or as a tacky nonphotosensitive layer of a multilayer element. The more detailed description of the process that follows will be exemplified by the use of the element comprising a flexible support bearing a single photoadhesive layer. The photoadhesive element can be used, for example, in sheet form or can be unwound from a roll and moved by means of a roll or other drive means to an exposure source, i.e., an actinic radiation source, whereby the element is exposed imagewise and tacky (adherent) image or images are defined. Suitable radiation sources depend on the photohardenable composition type. Generally, however, radiation sources that are rich in ultraviolet radiation are useful. Radiation sources are disclosed in U.S. Pat. Nos. 2,760,863, 3,649,268, and 4,157,407, the disclosures of which are incorporated by reference. The exposure may be through a phototool, negative or positive, having the circuit image including circuit trace. Special phototools may have to be used for particular needs such as crossovers or the formation of circuits useful in multilayer circuits.

Ductile metal and alloy particles, plating catalyst particles, or combinations thereof are applied to the imagewise exposed element. The particles adhere primarily to the tacky nonexposed image areas. Suitable particulate metals include: zinc, aluminum, iron, and other metals more reactive than the plating metal, e.g., copper, etc. The particles have an average diameter of about 1 to 50 $\mu$m, preferably 2 to 20 $\mu$m. Mixed particle sizes can be used.

The particles can be applied to the tacky (unexposed) image areas in known manner. A preferred application method is by use of a fluidized bed of particles, such as described in Research Disclosure, June 1977, No. 15882 by Peiffer and Woodruff which is incorporated by reference. Other application or toning means for the particulate metals are described in U.S. Pat. No. 3,060,024; 3,391,455; 3,506,483; 3,637,385; 3,649,268; and 4,019,821, all of which are incorporated by reference. It is preferred that the particulate metal is applied to the unexposed areas by embedding the metal into the surface.

To improve the retention of the metal particles in the tacky image areas preferably the photoadhesive layer of the element is heat set by passing it under or through a heating unit. A type of unit is an infrared heater such as a Cal Ray ® model by General Electric Co., Schenectady, N. Y. The element is maintained in the presence of the heater for about 0.1 to 5 minutes.

Any excess metal particles, if present in the nontacky image areas, should be removed. Suitable mechanical and other means for removing excess particles are described in the above-mentioned Research Disclosure. Preferably a water wash, e.g., by impingement jet, is used with gentle mechanical scrubbing. Air impingement devices are also useful as well as wiping means although care must be taken not to remove metal particles in the tacky image areas. The removal of excess particles occurs subsequent to the heat setting if this step is used.

It is preferred that adhesion of the particulate metal to the photoadhesive elements be improved further. The particulate metal can be fixed or bound to the photohardened layer by baking, e.g., in the temperature range of 80° to 150° C. for at least 10 seconds, the temperature being below the degradation temperature of the photoadhesive element; cured by exposure to actinic radiation, e.g., by means of an actinic radiation source as described above, or mechanical embedding, e.g., passing the toned circuit through the nips of mechanical rollers. Combinations of these means also can be used. The preferred fixing means is by exposure to actinic radiation, e.g., in the range of 0.25 to 10 minutes.

The metallized circuit is contacted with an aqueous solution comprising cations of a plating metal which is more electronegative than the particulate metal to accomplish a metal-metal ion displacement reaction. The aqueous solution is substantially free of any reducing agent for the cations. The electrical conductivity of the circuit formed is at least about 1 to 2 mhos/square and more, generally in the range of about 1 to 15 mhos/square. As shown in the examples below, zinc and aluminum particulate metal adhered to the photoadhesive element are treated with a copper sulfate solution or a copper acetate solution for 20 minutes at 50° C. Copper is more electronegative than either the zinc or aluminum particles, i.e., the metal particles have a higher oxidation potential in the electromotive force series than the plating metal. Other cations and anions can be present in the plating solution as is known to those skilled in the art to provide at least 1 mho/square. The treatment time can range from 5 to 120 minutes, and the temperature range from 20 to 95° C.

The metallized circuit is generally placed or dipped in the aqueous plating solution for the appropriate time but other methods of contacting can be used, e.g., pouring the solution over the metallized circuit, etc. The pH of the plating solution depends on the particular metal and metal ion involved in the reaction. For example, for $Cu^{2+}$ reacting with zinc metal, the optimum pH is 9 and for $Cu^{2+}$ reacting with aluminum, the optimum pH is 11. The concentration of $Cu^{2+}$ solutions can be varied with comparable results being obtained, e.g., between 0.036 and 0.076 M $Cu^{2+}$ solutions. The solution contains cations of the plating metal obtained by dissolving a soluble salt of the plating metal in water. It is appropriate at times to hold the cations in solution by the use of complexing agents. A useful complexing agent for copper cations is the tetrasodium salt of ethylenediamine tetraacetic acid ($Na_4$ EDTA). Other complexing agents are: sodium potassium tartrate, triethanolamine, N, N, N', N'-tetrakis(2-hydroxypropyl)ethylenediamine, etc.

The electrical conductivity in the range of about 1 to 10 mhos/square is not adequate for many circuit uses. It is therefore necessary to increase the electrical conductivity substantially, e.g., to greater than 500 mhos/square. This can be accomplished by electroplating or soldering the metallized circuit prepared as described above.

Electroplating procedures are known to those skilled in the art using plating baths generally containing copper. Various copper electroplating baths, as are known to those skilled in the art, may be used for the application of copper electroplate. Typically, the copper electroplating baths are aqueous acidic solutions of copper sulfate, copper fluoborate, copper nitrate, copper sulfamate, the copper alkyl sulfonates and disulfonates, etc. A copper pyrophosphate electroplating bath is also useful. Generally the copper plating baths also contain one or more additives which are effective in improving the lustre, leveling, ductility, etc. of the copper electroplate obtained. Typical copper electroplating baths and additives are described in U.S. Pat. Nos. 2,707,166; 3,267,010; and 3,288,690. The thickness of the electroplated circuit is in the range of about 5 to 50 μm.

While electroplating as described above is the preferred manner in which the electrical conductivity is increased, soldering techniques are also useful. One such technique is disclosed in Cohen and Peiffer, Published European Application No. 79100263.7 filed Jan. 30, 1979 which is incorporated by reference. Prior to soldering, the metallized areas are treated by known procedures with solder fluxes typified by the following compositions:

Rosin type, organic, e.g., a mixture of diterpene acids in alcohol, water, or other appropriate solvent;

Inorganic acids, e.g., HCl, orthophosphoric acid, etc.;

Inorganic salts, e.g., zinc chloride, ammonium chloride and combinations thereof used to produce HCl upon heating in the presence of water;

Organic acids, e.g., lactic, citric, oleic, etc.;

Organic halogen compounds, e.g., aniline hydrochloride, etc.;

Organic amines and amides, e.g., urea, etc.

These fluxes can contain curing or hardening catalysts or reagents.

The fluxed image areas are subsequently exposed to molten solder, e.g., solder waves, etc. Known solder compositions can be used, e.g., tin lead combinations, and compositions containing bismuth, cadmium, indium, silver and antimony. When the adherent material is thermally stable, low melting metals alone may be used, e.g., tin, lead, indium, etc. Preferred solders particularly useful in the preparation of printed circuits are tin/lead in ratios of 63/37 and 60/40. It is important to balance the ability to solder with the adhesion of the metal particles in the adherent image areas.

Two flexible circuits prepared as described above prepared either separately or simultaneously can be used in conjunction with one another to form circuits. One useful form is a membrane switch wherein the flexible circuits are placed in register face to face and are adhesively joined together, e.g., by lamination at elevated temperature, separated by a perforated dielectric layer which allows contact at desired points when mechanical pressure is applied to one side of the circuit. A membrane switch can also be prepared from a single flexible circuit as follows: (1) folding 180° the electrically conductive circuit having first and second sections having contactors and contacts, respectively, whereby the contactors and contacts are adjacent to each other, and (2) inserting between said folded conductive circuit a dielectric spacer having a plurality of openings therethrough for selective alignment with the contacts and contactors.

BEST MODE FOR CARRYING OUT THE INVENTION

The best mode is illustrated in Example 1 wherein the photoadhesive layer is metallized with zinc powder.

INDUSTRIAL APPLICABILITY

The process of this invention is applicable to the preparation of printed circuits which can be flexible. Single or multilayer printed circuits which include conductive vias between the layers can be prepared. Conductive vias can be prepared as described in Example 4 below. Improved conductivity and durability of the circuits are achieved by means of electroplating the electrically conductive metallized circuits. Easily adapted to automation, membrane switches can be prepared from flexible circuits. Such switches are useful as telephone keyboards, in electrical appliances, electrical toys, calculators, etc. which require a magnitude of depressions, e.g., millions, throughout their useful lives.

EXAMPLES

The following examples illustrate the invention wherein the parts and percentages are by weight.

EXAMPLE 1

A methylene chloride solution (82%) of a tacky photopolymer composition was coated on several flame-treated polyethylene terephthalate films, 0.005 inch (0.127 mm) thick, and was dried [0.002 inch (0.05 mm)]. The photopolymerizable (photoadhesive) composition was prepared from the following ingredients:

| Ingredient | Amount (parts) |
| --- | --- |
| Rubber [3% carboxy-modified acrylonitrile (27)/butadiene (73)], high molecular weight, average Mooney viscosity is 45 | 58.0 |
| Methylmethacrylate (34%)/styrene 42%/acrylonitrile(8%)/butadiene (16%)interpolymer | 12.5 |
| Trimethylolpropane triacrylate | 25.0 |
| 4,4'-Dichlorobenzophenone | 4.0 |
| 4,4'-Bis(dimethylamino)benzophenone | 0.5 |
| 1,4,4-trimethyl-2,3-diazabicyclo-[3.2.2]non-2-ene-2,3-dioxide | 0.05 |

A silicone release coated polypropylene film cover sheet, 0.003 inch (0.076 mm) thick, was laminated to the dry photopolymer layer giving flexible support-photopolymerizable layer-cover sheet sandwiches (elements).

A positive transparency of a printed circuit (phototool) was placed in contact with the cover sheet side of the element, and the element was imagewise exposed for 30 units with a 5Kw actinic radiation source using a Riston ® PC24 Printer, E. I. du Pont de Nemours and Company, Wilmington, DE. The cover sheet and phototool were removed, and the circuit pattern as cascade toned with about 6.6 μm average diameter zinc powder (Certified Zinc Metal Dust, Fisher Scientific Co., Fair Lawn, N.J.) which adheres to the unexposed areas. The toned circuit was heated for 3 minutes in a 150° C. oven to heat set the toned areas. Excess zinc powder was removed with water and mild abrasion. The metallized element was cured by exposing to ultraviolet radiation in an Argus Ultraviolet Processor Model PC7100 manufactured by Argus International, Hopewell, NJ for 15 seconds. The toned circuit was then treated at 50° C. for 20 minutes with a copper sulfate solution (0.036M $CuSO_4$ and 0.086M $Na_4EDTA$, at pH 9.0). Copper spontaneously plated on the zinc toned areas making the circuit pattern electrically conductive, 11 mhos/square. The copper plated circuit was then electroplated for 20 minutes at 10 amps/ft$^2$ in an acid copper electroplating solution wherein each liter of plating solution contains 47 g copper sulfate, 184 g sulfuric acid, 70 mg HCl and 5 g Copper Gleam PC (Lea Ronal Co., Freeport, N. Y. (Copper Gleam PC is a proprietary brightner). After electroplating, the electrical conductivity of the printed circuits was greater than 500 mhos/square.

EXAMPLE 2

A methylene chloride(92)/methanol(8) solution (72%) of a photopolymer composition was coated on a silicone release polyethylene terephthalate film, 0.001 inch (0.025 mm) thick, and was dried [0.002 inch (0.05 mm)]. The photopolymerizable composition (photoadhesive) was prepared from the following ingredients:

| Ingredient | Amount (parts) |
| --- | --- |
| Methylmethacrylate/butadiene/styrene copolymer, Acryloid ® KMBTA IIIF, Rohm and Haas, Philadelphia, PA | 13.4 |
| Epichlorohydrin ethylene oxide copolymer, specific gravity 1.27 | 12.5 |
| Rubber described in Example 1 | 2.3 |
| Di-(3-acryloxy-2-hydroxypropyl)-ether of bisphenol-A | 24.4 |
| Trimethylolpropane triacrylate | 4.6 |
| Tripropyleneglycol diacrylate | 3.5 |
| Methylmethacrylate (95.5%)/ethyl acrylate (4.5%) copolymer, density 1.196, glass transition T = 100° C., inherent viscosity of 0.5 in methylene chloride (0.5 g in 50 g solvent) | 5.6 |
| 4,4'-Bis(dimethylamino)benzophenone | 0.3 |
| 4,4'-Dichlorobenzophenone | 5.4 |
| Harwick 71R clay, highly transparent clay, 0.5 μm particle size | 27.85 |
| Monastral Green ® pigment (33%), rollmill blended with the interpolymer described in Example 1. | 0.10 |

On to the dry photopolymerizable layer was laminated a silicone release polyethylene terephthalate film which released more easily than the support film. The cover sheet was removed, and the photopolymerizable layer was laminated to a copper clad epoxy laminated circuit board. The laminate was exposed imagewise for 8 units using the actinic radiation source described in Example 1. After removal of the silicone release polyethylene terephthalate film, the circuit pattern was toned, heated and washed, as described in Example 1, each step, however, being repeated twice, and then the toned circuit was cured as described in Example 1. The cured, toned circuit was treated at 50° C. for 20 minutes with a copper acetate solution (0.036M $Cu(CH_3CO_2)_2$+0.086M $Na_4EDTA$ at pH 8.0). Copper spontaneously plated on the zinc toned areas making the circuit pattern electrically conductive, 15 mhos/square. The copper plated circuit was electroplated as described in Example 1 increasing the electrical conductivity of the printed circuit to greater than 500 mhos/square.

EXAMPLE 3

The procedure of Example 2 was repeated except that in place of the zinc powder, aluminum powder, 13 μm average diameter, was used to tone the tacky circuit image. The toned circuit was treated with the copper sulfate solution described in Example 1 at pH 11.7 for 20 minutes at 50° C. The electrical conductivity of the original aluminum toned image was 12 mhos/square and the electroplated printed circuit was greater than 500 mhos/square.

EXAMPLE 4

This example illustrates the formation of conductive vias between circuit layers. A photoadhesive element was prepared as described in Example 2, the photopolymerizable (photoadhesive) composition being prepared from the following ingredients:

| Ingredient | Amount (parts) |
| --- | --- |
| Di-(3-acryloxy-2-hydroxypropyl)-ether of bisphenol-A | 25.1 |
| Pentaerythritol triacrylate | 25.1 |

-continued

| Ingredient | Amount (parts) |
|---|---|
| Interpolymer described in Example 1 | 19.0 |
| Rubber described in Example 1 | 16.5 |
| Methylmethacrylate (95.5%)/ethyl acrylate (4.5%) copolymer | 7.8 |
| 4,4'-Dichlorobenzophenone | 6.3 |
| 4,4'-Bis(dimethylamino)benzophenone | 0.1 |
| Monastral Green ® pigment as described in Example 2 | 0.1 |

The cover sheet was removed and the photopolymerizable layer was laminated to a circuit board as described in Example 2. The photopolymerizable (photoadhesive) layer was exposed through an image of a printed circuit for 30 units using the actinic radiation source described in Example 1. After removal of the phototool and the silicone release polyethylene terephthalate film, the circuit pattern was toned, heated and washed as described in Example 1. The toned circuit board was reexposed for 160 units to the same actinic radiation source described above through a phototool defining vias, 0.030 inch (0.76mm), in the toned circuit pattern. The unexposed areas (the vias) were developed by treating with methylchloroform for 50 seconds. The circuit board was retoned with zinc powder used above and described in Example 1 to tone the via walls, followed by heating, washing and ultraviolet curing as described in Example 1. The toned circuit pattern and toned via walls were treated for 20 minutes at 50° C. with the copper sulfate solution described in Example 1. The electrical conductivity of the circuit pattern including vias was about 5 mhos/square. The circuit and vias are capable of being electroplated as described in Example 1.

EXAMPLE 5

Two layers are sequentially coated on a 0.0005 inch (ca. 0.013 mm) thick electrostatically discharge (e.d.) treated polyethylene terephthalate film. The bottom layer is photosensitive and has a coating weight of 35 mg/dm$^2$ when dried. It is coated from a solution having the following composition:

| Ingredient | Weight (g) |
|---|---|
| Poly(methyl methacryate/methacrylic acid) (90/10) (M.W. 30,000–50,000) | 75.0 |
| Polyethylene glycol dimethacrylate | 57.5 |
| (2-o-Chlorophenyl-4,5-diphenyl imidazolyl) dimer | 6.0 |
| 2-(stilbyl-4″)-(naphtho-1',2',4,5)-1,2,3-triazol-2″-sulfonic acid phenyl ester | 0.79 |
| 7-(4'-chloro-6'-diethyl amino-1,3',5'-triazine-4'-yl)amino-3-phenyl-coumarin | 3.55 |
| 2,2'-Dihydroxy-4-methoxybenzophenone | 0.32 |
| 2-Mercaptobenzothiazole | 2.0 |
| Methyl alcohol | 77.5 |
| Methylene chloride | 870.0 |

The top layer is tacky and has a coating weight of 100 mg/dm$^2$ when dried. It is coated from a solution having the following composition:

| Ingredient | Weight (g) |
|---|---|
| Styrene/butadiene block copolymer (25/75) (Typical Mooney Viscosity ML4 at 100° C. 47) | 15.0 |
| Cis-polybutadiene (Mooney Viscosity 55–60) | 20.0 |
| Methylene chloride | 65.0 |

This two layer film is laminated to a copper clad laminate with the tacky layer in contact with the copper clad laminate. A phototool is placed on the surface of the laminate, and the laminate is exposed through the e.d. treated polyethylene terephthalate film for 15 seconds on an exposure device identified as the nuArc ® Plate Maker "Flip-Top" manufactured by the nuArc Company, Chicago, IL. The board is held for 5 minutes, and the e.d. treated polyethylene terephthalate film is stripped from the photosensitive layer at an angle of from 135°–180° at a rate of higher than 9000 inches/minute (228.6 meters/minute). Exposed areas of the photosensitive layer adhere to the e.d. treated polyethylene terephthalate film and are removed when the film is peeled off exposing the tacky layer. The circuit pattern is toned with zinc powder, washed to remove excess zinc powder, ultraviolet radiation cured at 10 feet/minute (5.08 cm/minute) using an Argus Ultraviolet Processor Model PC 7100, manufactured by Argus International, Hopewell, NJ., as described in Example 1, baked for 2 hours at 150° C., and treated with copper sulfate solution as described in Example 1. The circuit can then be electroplated to improve electrical and physical properties.

EXAMPLE 6

A tacky, nonphotosensitive composition is screen printed in a circuit pattern on a glass epoxy laminate from a solution having the following composition:

| Ingredient | Weight (g) |
|---|---|
| Styrene/butadiene block copolymer (25/75) (Typical Mooney Viscosity ML4 at 100° C. 47) | 15.0 |
| Cis-polybutadiene (Mooney Viscosity 55–60) | 20.0 |
| Methylene chloride | 65.0 |

This layer is 0.0006 inch (0.015 mm) thick after drying. The circuit pattern is toned with zinc powder, heated for 3 minutes to 150° C., washed to remove excess zinc powder, and treated with copper sulfate solution as described in Example 1. The circuit obtained can then be electroplated to improve electrical and physical properties.

I claim:

1. A process for the preparation of electrically conductive circuits from an element having tacky and nontacky image areas present in a photoadhesive layer which comprises:
   (a) applying particulate metal taken from the group consisting of zinc and aluminum to the tacky image areas of the element;
   (b) optionally removing excess particulate metal; and
   (c) contacting the metallized element with an aqueous solution at a pH in the range of 8 to 11.7 comprising cations of a plating metal which is more electronegative than said zinc or aluminum particulate metal to accomplish a metal-metal ion displacement reaction and being substantially free of any chemical reducing agent for said cations whereby there is provided a conductivity of at least about 1 to 2 mhos/square.

2. A process according to claim 1 wherein the particulate metal is fixed or bound to the tacky image areas by heating, curing by exposing to actinic radiation, embedding mechanically, and combinations thereof.

3. A process according to claim 1 wherein the particulate metal bearing or metal containing image areas are electroplated or soldered.

4. A process according to claim 1 wherein the photoadhesive layer comprises an addition polymerizable ethylenically unsaturated compound having at least one terminal ethylenic group, (ii) at least one organic polymeric binder compound, and (iii) a free radical generating addition polymerization initiator or initiator system activatable by actinic radiation.

5. A process according to claim 4 wherein the binder is a combination of methylmethacrylate/styrene/acrylonitrile/butadiene interpolymer and a carboxylated acrylonitrile/butadiene rubber compound.

6. A process according to claim 1 wherein the element having tacky and nontacky image areas comprises, in order from bottom to top: a support, a tacky nonphotosensitive layer, a photohardenable or photopolymerizable layer, and, optionally, a cover sheet, and after imagewise exposure of said element to actinic radiation and removal of the cover sheet, if present, or liquid development, nontacky, nontonable image areas are present in the photohardened or photopolymerized layer and tacky, tonable image areas are present in the lower nonphotosensitive layer.

7. A process according to claim 1 wherein the tacky image areas are present as tacky adhesive images.

8. A process according to claim 1 wherein the particulate metal is zinc.

9. A process according to claim 1 wherein the particulate metal is aluminum.

10. A process according to claim 2 wherein the particulate metal is fixed or bound to the tacky image areas by heating in the temperature range of 80° C. to 150° C., for at least 10 seconds, the temperature being below the degradation temperature of the metallized image areas.

11. A process according to claim 1 wherein the element having tacky and nontacky image areas comprises a flexible support and a dry, tacky photoadhesive layer comprising a photoadhesive composition, optionally including at least one organic elastomeric polymeric binder.

12. A process according to claim 1 wherein multilayer printed circuits are prepared which includes conductive vias between the layers.

* * * * *